(12) United States Patent
Yates et al.

(10) Patent No.: US 7,281,076 B2
(45) Date of Patent: Oct. 9, 2007

(54) FORM FACTOR CONVERTER AND TESTER IN AN OPEN ARCHITECTURE MODULAR COMPUTING SYSTEM

(75) Inventors: Kirk Yates, Loomis, CA (US); Andrew Michael Cherniski, Rescue, CA (US); Kevin Boyum, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 208 days.

(21) Appl. No.: 10/427,767

(22) Filed: Apr. 30, 2003

(65) Prior Publication Data

US 2004/0221084 A1 Nov. 4, 2004

(51) Int. Cl.
G06F 13/14 (2006.01)
H05K 7/00 (2006.01)
G06F 13/38 (2006.01)

(52) U.S. Cl. ................................ 710/305; 361/760
(58) Field of Classification Search ................ 710/300, 710/305–306, 311; 361/728–759, 760–783, 361/784–804
See application file for complete search history.

(56) References Cited

U.S. PATENT DOCUMENTS

| | | | |
|---|---|---|---|
| 4,985,893 A * | 1/1991 | Gierke | 714/29 |
| 5,884,027 A | 3/1999 | Garbus et al. | |
| 5,913,045 A | 6/1999 | Gillespie et al. | |
| 5,951,665 A * | 9/1999 | Crane et al. | 710/306 |
| 6,138,183 A | 10/2000 | Tien et al. | |
| 6,157,976 A | 12/2000 | Tien et al. | |
| 6,359,938 B1 | 3/2002 | Keevill et al. | |
| 6,449,699 B2 | 9/2002 | Franke et al. | |
| 6,484,280 B1 * | 11/2002 | Moberly | 714/726 |
| 6,662,254 B1 * | 12/2003 | Tal et al. | 710/300 |
| 6,662,255 B1 * | 12/2003 | Klein | 710/301 |
| 6,986,385 B1 * | 1/2006 | German et al. | 713/300 |
| 2003/0038177 A1 * | 2/2003 | Morrow | 235/441 |
| 2003/0084220 A1 * | 5/2003 | Jones et al. | 710/301 |
| 2003/0235042 A1 * | 12/2003 | Harris et al. | 361/752 |
| 2004/0003154 A1 * | 1/2004 | Harris et al. | 710/300 |
| 2004/0059856 A1 * | 3/2004 | Chan et al. | 710/301 |

OTHER PUBLICATIONS

Schroff; "Adapter"; archived from Dec. 12, 2002; available online at <http://web.archive.org/web/20021205023833/http://www.pentair-ep.com/dev/atca/default.asp?P=products&S=adapter>.*
Phillips Semiconductors; "The I²C Specification"; Phillips Semiconductors; Version 2.1; Jan. 2000.*
PCI Special Interest Group; "Mini PCI Specification"; PCI Special Interest Group; Revision 1.0; Oct. 25, 1999; all pages.*

* cited by examiner

Primary Examiner—Paul R. Myers
Assistant Examiner—Ryan M Stiglic

(57) ABSTRACT

A converter assembly comprises a backplane interface to a backplane compliant with a first open architecture modular computing system standard, a component interface capable of coupling to a component compliant with a second open architecture modular computing system standard, and a control element. The control element is coupled between the backplane interface and the component interface and is capable of programmably routing connection lines and signals between the component interface and the backplane interface.

12 Claims, 11 Drawing Sheets

FORM FACTOR CONVERTER AND TESTER IN AN OPEN ARCHITECTURE MODULAR COMPUTING SYSTEM

BACKGROUND

Modular systems have developed over the decades from a first generation centered upon a processor bus and primarily used for control applications to a second generation centered upon a chip interconnect for usage in communications and control. First generation technology originated about 1980 and utilizes VERSAmodule Eurocard (VMEbus) technology along with Multibus I and II standards. Second generation products became available around 1994 and utilizes CompactPCI (Peripheral Component Interconnect) buses. Various technologies and standards have been developed in the second generation including Ethernet, Packet, Backplane extension, and others, extending to integration of telephony with computing, how swap, high availability, wide operating system support, wide PCI silicon support, and the like. Various standards have been created to facilitate connectivity and cooperation among components and systems. One such standard is the Peripheral Component Interconnect (PCI) Industrial Computer Manufacturers Group (PICMG™) 2.16 specification.

Technology is currently at the beginning of a new, third generation that extends capabilities to fabric interconnects, primary applications, central office telecommunications, communications control, and data communication dense servers. Features implemented and planned for the third generation include carrier grade features, performance expansion to tens of gigabits out to terabits, backplane scalability to support fabrics, and processing scalability to include multiple processors, and digital signals processors. Third generation supplies support for convergence of access, core, optical, switching, server, storage, voice, data, video, and wireless functions.

Standardization bodies taking part in the development of third generation standards have considered the desirability of maintaining form factors and interconnect configurations of previous generation systems, but chose for various reasons to establish completely new standards. The standardization bodies determined that board areas from former generations are too small and board spacing too narrow to accommodate emerging applications. Previous generation heat dissipation was found inadequate for next generation semiconductors and backplane capacity severely limited. Signal integrity and electromagnetic compatibility have arisen as new problems. Old generation mechanical standards fail to support input/output requirements.

As a result, third generation standards specify form factors and configurations that are incompatible with the standards of previous generations. A consequence of the new standards is that a large body of highly useful technology and many products are rendered obsolete.

SUMMARY

What are desired are an apparatus and system that enable usage of legacy generation products and technologies in new generation systems.

According to some embodiments, a converter assembly comprises a backplane interface to a backplane compliant with a first open architecture modular computing system standard, a component interface capable of coupling to a component compliant with a second open architecture modular computing system standard, and a control element. The control element is coupled between the backplane interface and the component interface and is capable of programmably routing connection lines and signals between the component interface and the backplane interface.

According to other embodiments, a converter assembly comprises a backplane interface to a backplane compliant with a first open architecture modular computing system standard and having at least one channel including a bi-directional two wire bus, and a component interface capable of coupling to a component compliant with a second open architecture modular computing system standard. The converter assembly further comprises a plurality of interconnect lines routing connection lines and signals between the component interface and the backplane interface, a display interface capable of coupling to a display, and a control element. The control element is coupled to the backplane interface, the component interface, and the display interface. The control element is capable of snooping the bi-directional two wire bus and converting data on the bi-directional two wire bus to a readable format for display via the display interface.

According to further embodiments, an assembly comprises a printed circuit board including first and second interfaces with physical dimensions capable of respectively interfacing to a backplane compliant with a first open architecture modular computing system standard and interfacing to a component compliant with a second open architecture modular computing system standard. The assembly further comprises at least one power converter mounted on the printed circuit board and capable of converting power from a single source to a power levels utilized on the printed circuit board, and a control element. A control element is capable of programmably routing connection lines and signals between the component interface and the backplane interface.

BRIEF DESCRIPTION OF THE DRAWINGS

Embodiments of the invention relating to both structure and method of operation, may best be understood by referring to the following description and accompanying drawings.

DETAILED DESCRIPTION

Figure 1:
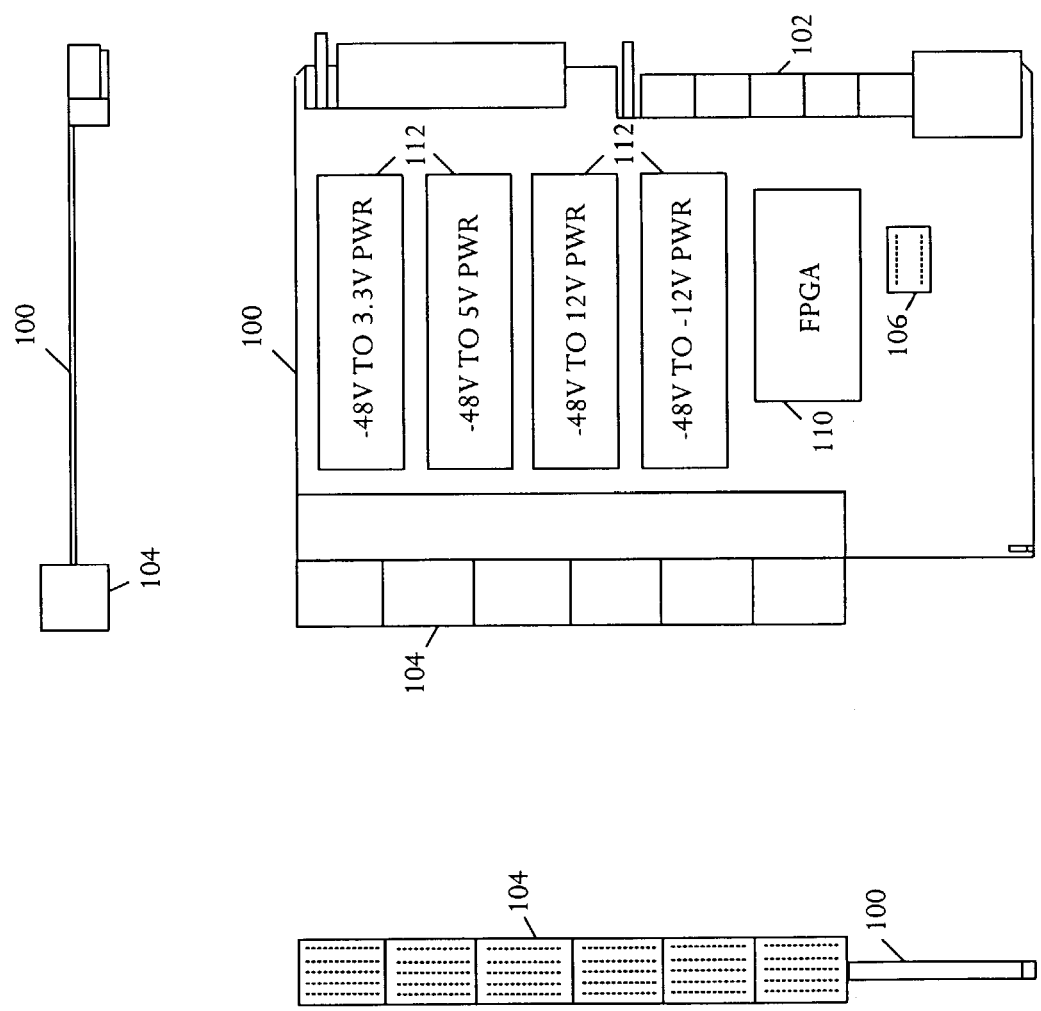
FIG. 1 is a schematic pictorial diagram illustrating an embodiment of a converter assembly that can be used to connect components with a form factor and signals compliant to a particular open architecture modular computing system standard to a backplane configured according to a different standard

Referring to FIG. 1, a schematic pictorial diagram illustrates an embodiment of a converter assembly 100 that can be used to connect components with a form factor and signals compliant to a particular open architecture modular computing system standard to a backplane configured according to a different standard. In a particular example, the converter assembly 100 enables use of PICMG™ 2.16 compliant circuit card assemblies, printed circuit boards, components, and the like in a PICMG™ 3.0 system. The form factor defined for PICMG™ 2.16 CompactPCI circuit boards derives from the Eurocard form factor documented in International Electrotechnical Committee (IEC) 60297-3 and IEC 60297-4 and extended by Institute of Electrical and Electronics Engineers (IEEE) 1101.10 including 3U (100 mm by 160 mm) and 6U (233.35 mm by 160 mm) board sizes. Many manufacturers use the PICMG™ 2.16 form factor in 6U and 3U product lines and have invested a large amount of time and capital in PICMG™ 2.16 products.

The converter assembly 100 has a backplane interface 102 compliant with a first open architecture modular computing system standard, a component interface 104 capable of coupling to a component compliant with a second open architecture modular computing system standard, and a control element 110. In a particular embodiment, the converter assembly 100 enables integration and usage of PICMG™ 2.16 designs in a 3.0 system. The converter assembly 100 saves manufacturer resources by extending the lifetime of legacy products in systems compliant with new standards. Similarly, the converter assembly 100 saves customer resources by allowing usage of legacy products in modular systems that may combine components of different standards generations.

The control element 110 is coupled between the backplane interface 102 and the component interface 104 and is capable of programmably routing connection lines and signals between the component interface 104 and the backplane interface 102. The control element 110 includes programming that determines functionality and availability to communication and control signals between backplane signals and the component signals. The control element 110 may comprise a plurality of programmable elements such as Field Programmable Gate Arrays (FPGAs) to establish functionality and definition of connections between the differing standards of the components and the system. The system may include multiple individual control elements 110 with the individual elements being designed according to the specifications of the particular signals routed through the elements from the backplane interface 102 compliant with a first open architecture modular computing system standard to the component interface 104 compliant with a different standard. For example, the control element 110 can be used to enable utilization of PICMG™ 2.16 standard components to a PICMG™ 3.0 standard backplane. The control element 110 further enables downloading of various different test functions to test different PICMG™ blades without modifying existing hardware in the converter assembly 100.

The converter assembly 100 can also be used to test and/or integrate elements, sometimes called blades, in a system such as a bladed server. The system can integrate any type of element, for example storage components, processors, communication elements, and others. The illustrative converter assembly 100 may include a display interface 106 capable of coupling to a display, and at least one control element 110 that can be used to configure connector and signal layout and placement according to the combined specifications. The control element can also be used as a test controller. The backplane has at least one channel that further comprises a bidirectional two wire bus such as an $I^2C$ bus. The control element 110 is capable of snooping the bi-directional two wire bus and converting data on the bi-directional two wire bus to a readable format for display via the display interface 106.

The converter assembly 100 may have various forms such as a circuit board, printed circuit board, a portion of a printed circuit board or other circuit board, multiple circuit boards, an integrated circuit chip, and the like. In some embodiments, the converter assembly 100 may include one or more power converters 112 mounted on the converter assembly 100 and capable of converting power from a single source to a power levels utilized on the converter assembly 100. In the illustrative example, the converter assembly 100 has a plurality of separate individual power converters 112. The illustrative power converters 112 include a −48V to 3.3V, 50W converter, a −48V to 5V, 50W converter, a −48V to 12V, 50W converter, and a −48V to −12V, 36W converter. Other examples may include power converters 112 that converter other voltages and wattages.

The control element 110 may be implemented as various types of elements such as Field Programmable Gate Arrays (FPGA), controllers, processors, microprocessors, digital signal processors, state machines, volatile memories such as Random Access Memories (RAM), nonvolatile memories of various types, Read Only Memories (ROM), and others. The control element 110 generally includes a controller or processor in combination with a storage element capable of storing a set of codes or instructions that execute on the controller or processor. The storage element functions as a medium, and/or is programmed or loaded from a medium that determines functionality and operations of the control element 110. The storage element may be programmed or loaded with a computable readable program code made available via an appropriate media that embodies operations such as test functions. Various media may include disk or tape storage media, and media made available from remote locations via electronic or communication channels.

The converter assembly 100 complies with various standards and specifications. In the illustrative example, the converter assembly 100 meets specifications for open architecture modular system according to a Peripheral Component Interconnect (PCI) Industrial Computer Manufacturers Group (PICMG™) specification. For example, the converter assembly 100 can be used to facilitate testing of a PICMG™ 3.0 system including testing and integration of individual 3.0 blades and/or entire systems. In a particular application, the converter assembly 100 scan same time and thus cost by enabling standardization and expediting of tests within PICMG™ systems.

PCI Industrial Computer Manufacturers Group (PICMG™) 3.0 specification defines a standard for open architecture modular computing components that can be easily and quickly integrated to support a variety of network elements, processors, storage devices, and input/output elements. PICMG™ supports and integrates multiple wireless, wireline, and optical network elements and supports many types and varieties of processors, digital signal processors (DSPs), storage, and I/O systems. PICMG™ supports high levels of modularity, configurability, scalability, and availability.

Mechanical packaging for PICMG™ 3.0 systems addresses functional needs of central office and-data center environments. Basic PICMG™ elements include a backplane, boards that plug into a front section of the backplane, transition modules that plug into a rear section of the backplane, and a rackmount shelf. Features of the PICMG™ specification include a board size sufficient for a high level of integration and functionality, enough front panel space for I/O connectors and mezzanines, clearance for tall components, and support for high power and cooling levels.

A PICMG™ 2.16 to 3.0 converter assembly 100 enables $I^2C$ bus snooping by allowing the display, for example a Liquid Crystal Display (LCD) to be connected to the $I^2C$ bus through control elements 110. The control elements 110 convert data from the $I^2C$ bus format to a readable format enabling a person performing tests and analysis to better evaluate communication on the $I^2C$ bus. The PICMG™ 2.16 to 3.0 converter assembly 100 can enable stressing and testing of every signal passing across the backplane. The display shows graphics to confirm test results.

Figure 2A:
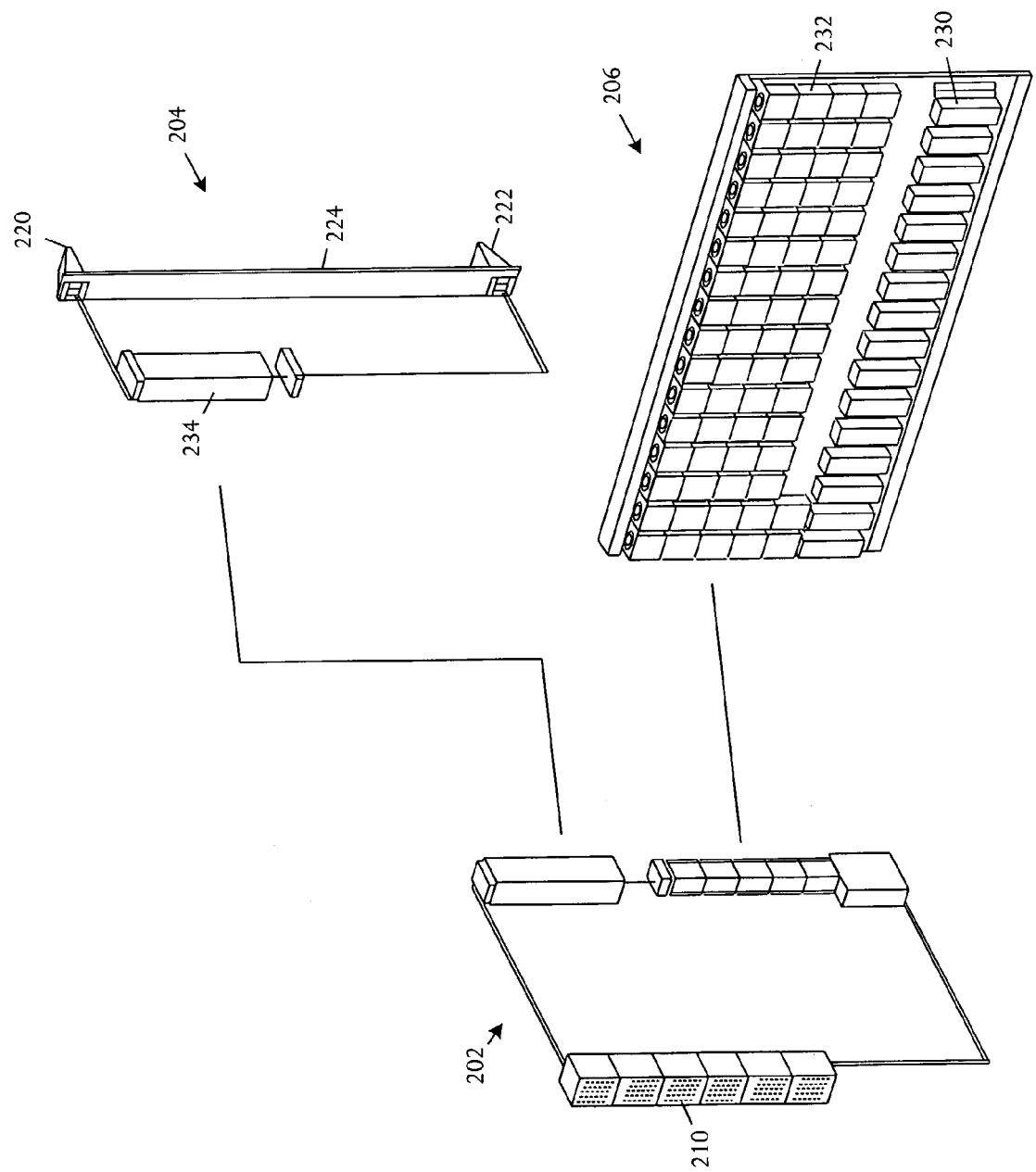
FIGS. 2A, 2B, and 2C are multiple schematic diagrams respectively illustrating a converter board, a rear transition module (RTM), and a backplane according to a standard configuration.
Figure 2B:
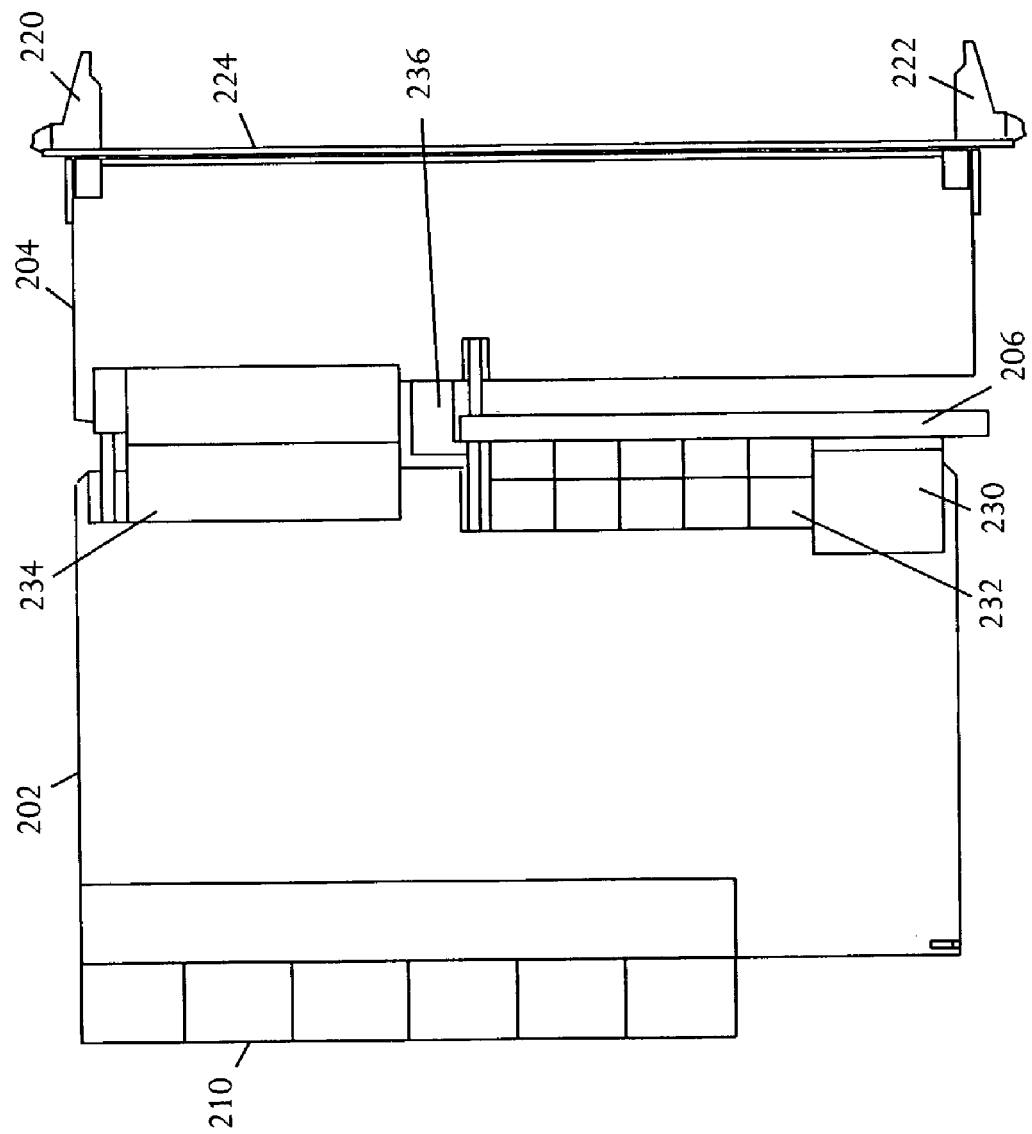
Figure 2C:
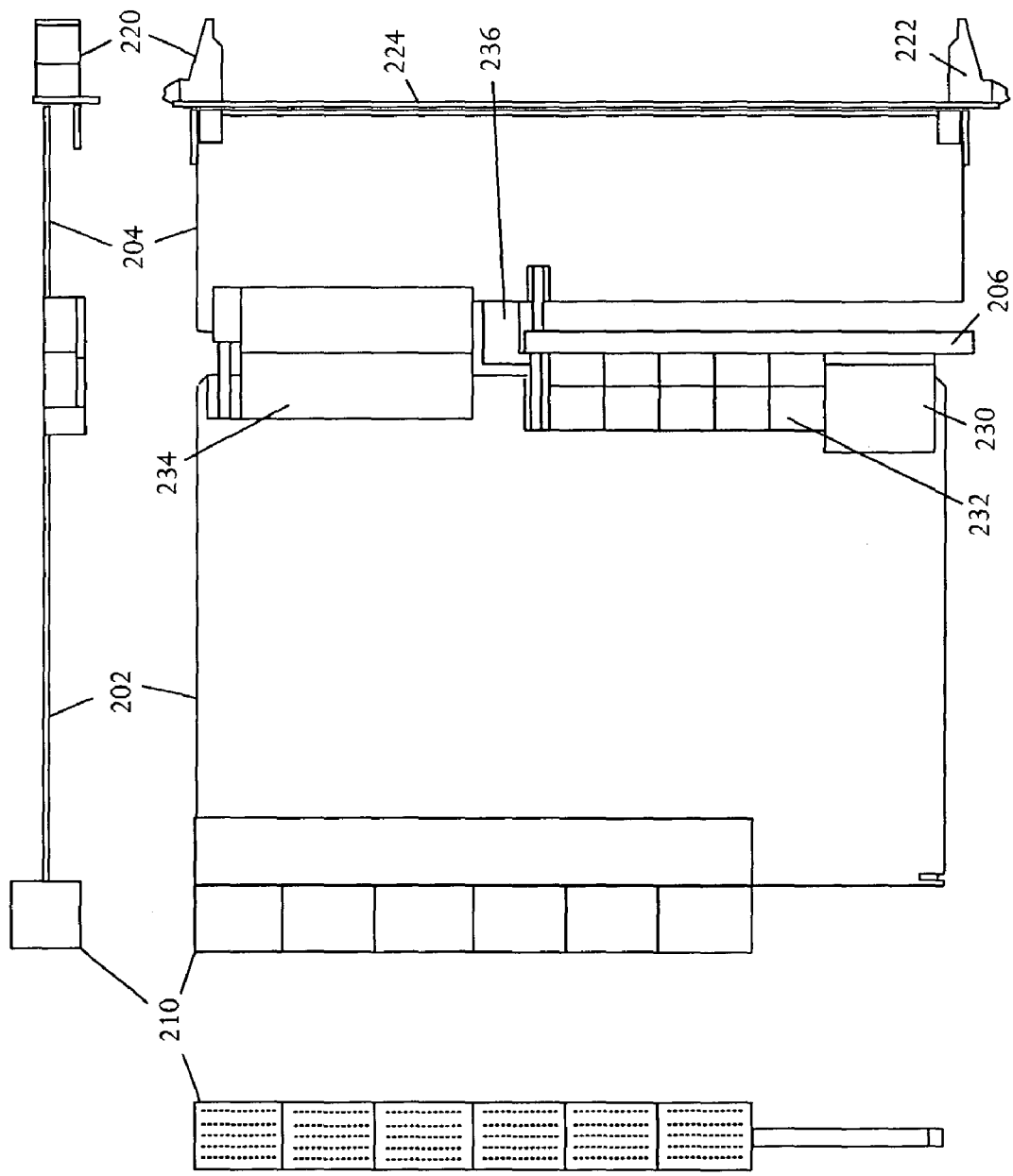

Referring to FIGS. 2A, 2B, and 2C, multiple schematic diagrams respectively illustrate a converter board 202 or assembly, a rear transition module (RTM) 204, and a backplane 206 according to a standard configuration, specifically the PICMG™ 3.0 standard configuration. In an illustrative embodiment, the converter assembly board 202 complies with PICMG™ 3.0 form factor height and thickness, but differs from the specified PICMG™ 3.0 width. In a specific embodiment, the form has a width reduced to approximately 135 mm to enable insertion of a board compliant with the PICMG™ 2.16 form into a PICMG™ 3.0 system. The connector and signal layout and placement of the converter assembly board 202 is flexibly determined by programmable elements such as one or more Field Programmable Gate Arrays (FPGA) to mutually conform interconnects of the PICMG™ 2.16 component for connection to the PICMG™ 3.0 system. In other embodiments, the converter assembly board 202 can be used to convert components for utilization in dissimilar systems in accordance with other standard definitions.

Figure 3:
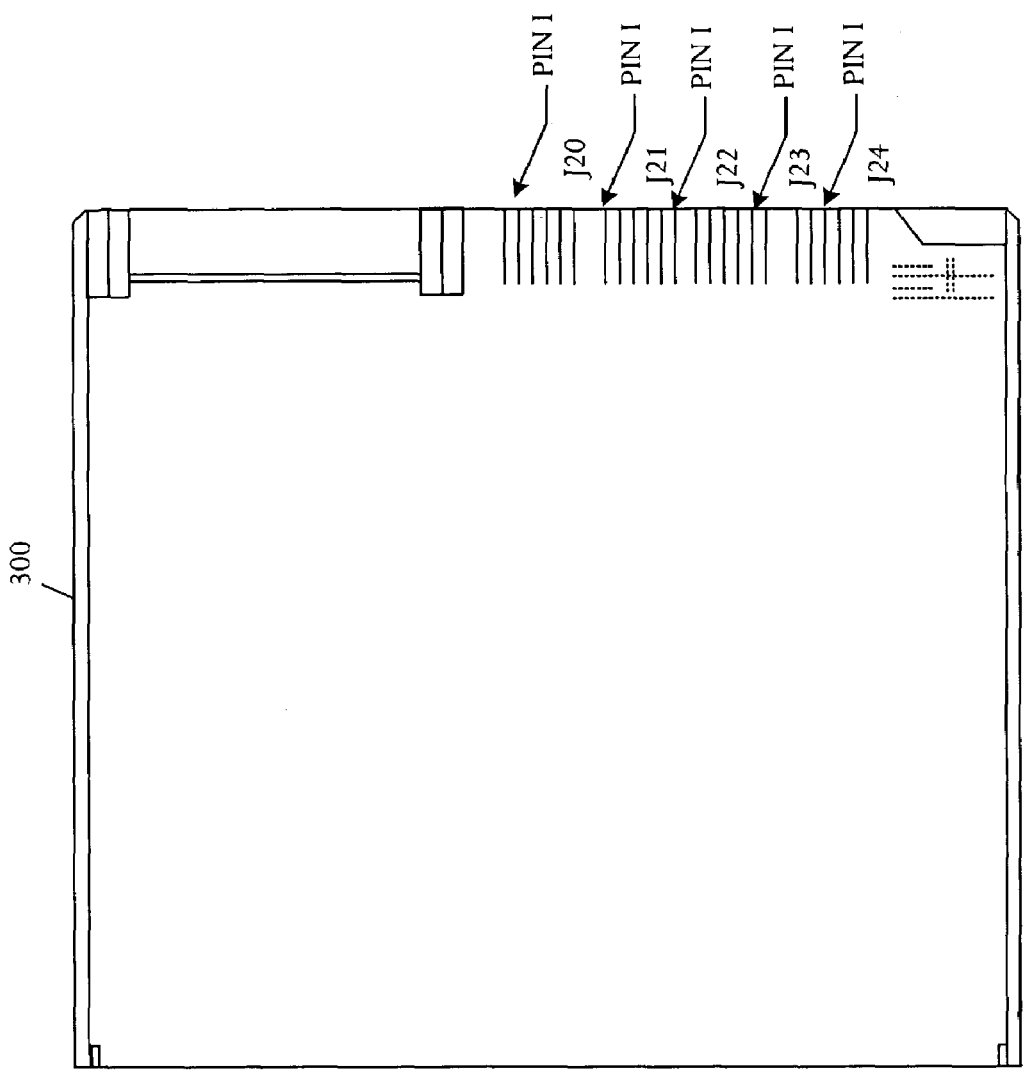
FIG. 3 is a schematic pictorial diagram showing the form factor of a printed circuit board in accordance with the PICMG™ 2.16 and 3.0 specifications.

FIG. 2A is a perspective pictorial diagram showing connections of the board 202 with both a RTM printed circuit board configuration 204, and a 16-slot backplane example 206. FIG. 2B is a pictorial side view showing the arrangement of the board 202, backplane 206, and RTM 204. The converter assembly board 202 has a connector 210 for connecting to a component having a different form factor in comparison to the backplane 206. In the illustrative example, the connector 210 is a PICMG™ 2.16 format connector for connecting to a PICMG™ 2.16 component. And the backplane 206 is a PICMG™ 3.0 form factor backplane. The RTM 204 has top 220 and bottom 222 handles and an RTM panel 224. Connectors are separated into three zones, a power and management zone 1 230, a data transport zone 2 232, and a rear I/O zone 3 234. Also shown is a backplane support bar 236. FIG. 2C shows correspondence of top and front views to the side view. FIG. 3 is a schematic pictorial diagram showing the form factor of a printed circuit board 300 in accordance with the PICMG™ 3.0 specification.

PICMG™ specifies connectors in three zones. Zone 1 230 includes DC power, ring/test voltages, and shelf management system connections including hardware addresses using dual redundant minus 48V DC power. Zone 2 232 supports up to five Zd connectors per board to cover data fabric such as base fabric and extended fabric, update channels, and bused timing clocks. Zone 3 234 defines rear panel I/O connectors.

Zone 1 230 connectors are defined as the interface between subracks and boards for dual redundant −48V DC power, metallic test, ringing generator, shelf management system connections, and hardware addressing. The zone 1 230 connector has eight power contacts and 26 low current contacts. A single connector is capable of supplying power to single-wide or double-wide slots/boards. The −48V DC power circuit definition is used generically or nominally and refers to the DC voltage level supplied, which can range from −36V DC to −72V DC.

The ring 1 metallic test circuits enable access to a shared pair of common shared test buses in the backplane. A card may function as a metallic test head, a line termination unit, or both. The backplane may also route the signals to connectors that permit connection of external test heads or creation of daisy-chain multiple shelves. Usage of two pairs supports testing of 4-wire circuits such as T1s, or supports test heads of different types simultaneously on the same shelf.

Referring again to FIG. 2B, within a zone 2 (232) connector each row or wafer contains four differential signaling pairs with each pair having an individual L-shaped ground contact. The ground contact is connected to a logic ground on a board with backplane ground contacts interconnected and connected to logical ground.

Zone 3 234 has three interconnect types including: (1) an interconnect mating a board directly to a rear transition module (RTM) with no intermediate backplane interconnection, (2) a connection with no rear-side connection to the shelf, (3) a connection using a cable bulkhead using metal brackets that mount above the backplane to supply direct cable connections to boards through zone 3 234, and (4) a connection using an auxiliary backplane region that may extend the backplane from zone 1/zone 2, or may be a separate zone 3 234 backplane.

The rear transition modules (RTMs) are optional modules that facilitate board servicing by moving I/O cable assemblies from the board to the RTM. I/O signals from the board are routed to zone 3 234 where a user-defined connector mates with the RTM and passes signals outside the rear of the shelf, enabling servicing of boards without disconnecting and reconnecting multiple cable assemblies.

Referring again to FIG. 1, in some PICMG™ 3.0 applications the converter assembly 100 can support functionality and availability to all communication and control signals across the backplane 206. Other applications may limit the communication and control signals that can be accessed. For example, the converter assembly 100 includes multiple control elements 110 such as FPGAs with particular control elements 110 configured for specific signals via a PICMG™ 3.0 backplane connector. Multiple FPGAs enable flexible design via a capability to download different test functions for testing different 3.0 blades without modifying converter assembly hardware.

Figure 4A:
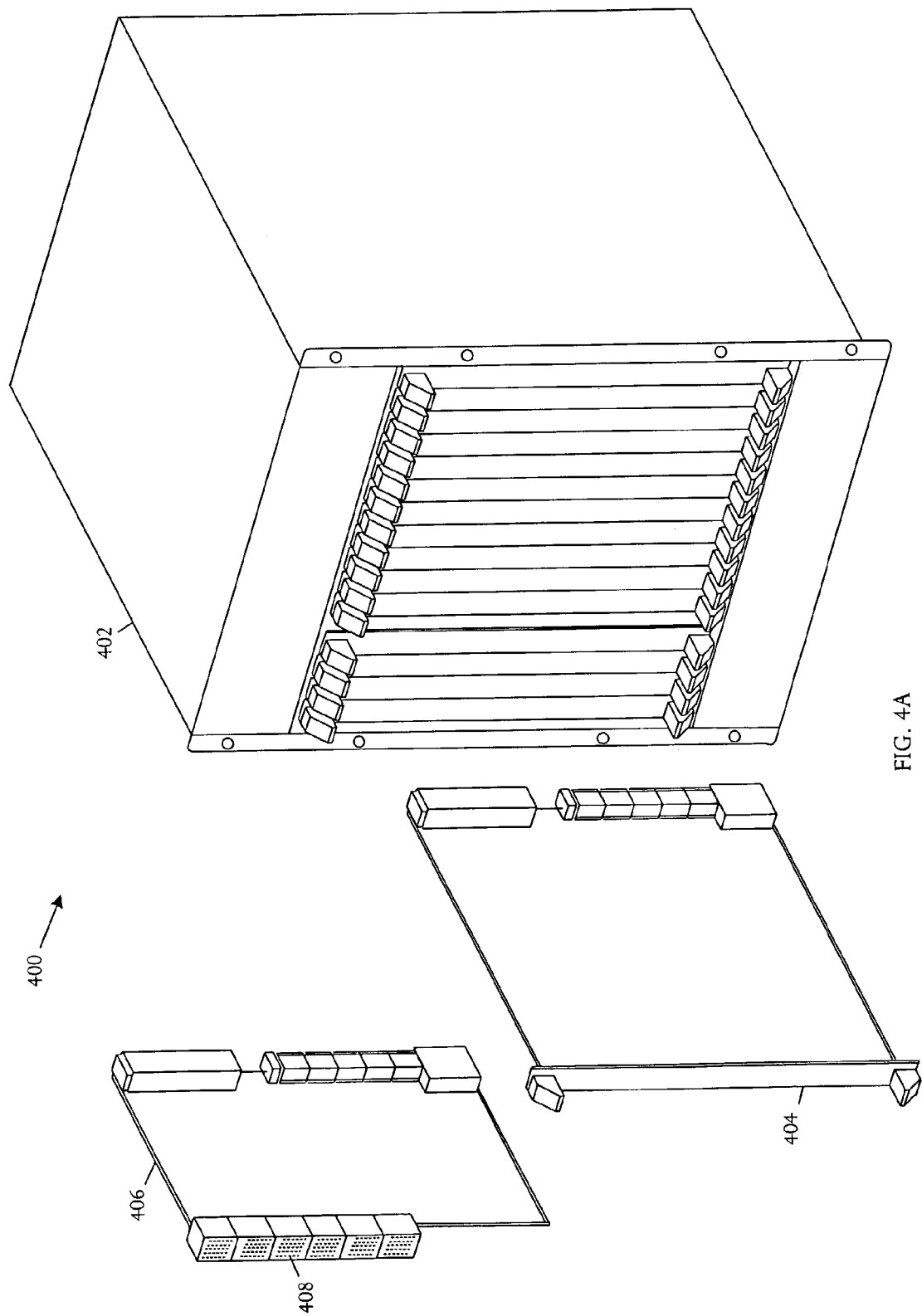
FIGS. 4A and 4B are schematic pictorial diagrams respectively showing an example of a shelf level implementation and a frame level implementation with a plurality of shelves.
Figure 4B:
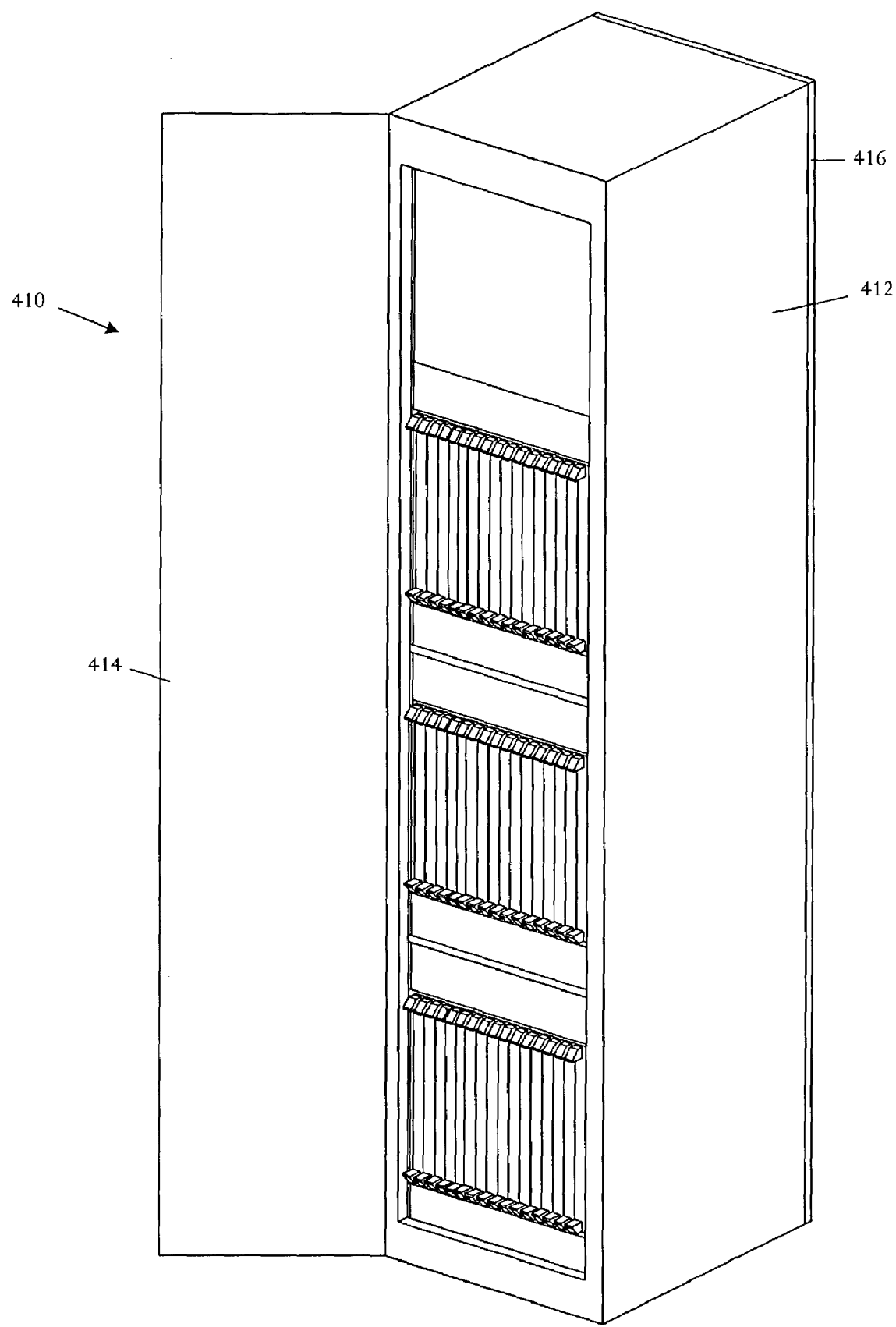

Referring to FIGS. 4A and 4B, schematic pictorial diagrams respectively show an example of a shelf level implementation 400 and a frame level implementation 410 with a plurality of shelves 400. The shelf 400 includes a card cage 402 or housing that can accept a plurality of boards 404 or card assemblies. The boards 404 and card cage 402 have a configuration in compliance with a defined first standard, for example the PICMG™ 3.0 specification. The illustrative system shows a converter assembly board 406 for connecting components in a configuration compliant with a defined second standard, different from the first standard, and can be inserted into the card cage 402 in place of a board 404. For example, the converter card 406 has a component connector 408 in a configuration compliant with the second standard and enables connection of standard-dissimilar components to the system. In the illustrative example, the converter card 406 enables connection of PICMG™ 2.16 boards to a PICMG™ 3.0 system.

The frame 410 includes a cabinet 412 that holds shelves 400 on a plurality of levels. The cabinet 412 has a front door 414 and rear door 416 for accessing cards, boards, and shelves 400. The illustrative frame 410 houses up to three shelves 400 in addition to a level that holds PDU.

At the board, shelf 400, and frame 410 level, the system is designed to attain high density footprint-efficient packaging and facilitate servicing from front and rear. The system also is configured to supply sufficient cabling space, airflow, power entry.

PICMG™ 3.0 specification specifies dual, redundant −48V DC supplied to each frame 410 from one or two power plants within a facility. In some facilities, a signal conditioning panel filters the power lines to reduce radiated and conducted noise, feed cable inductor compensation, overcurrent protection, and voltage ripple. Primary feeds are divided into multiple branches although remaining mutually isolated. PICMG™ 3.0 shelves supply the dual DC feeds to all front plug-in boards through a zone 1 connector mounted on the backplane.

All power is supplied on the dual, redundant −48V DC feeds in PICMG™ 3.0 systems. Logic voltages are generated on each board, if needed, and are implemented using isolated power supplies, normally DC-DC converters, that reside on the individual boards. DC isolation prevents a low impedance path between the −48V DC feeds and board circuitry. Frame level power distribution includes power filtering and circuit protection within the distribution panel.

In the converter assembly 100 depicted in FIG. 1, the power converters 112 access the −48V DC power feeds from the backplane 206 and convert to power levels that are usable by components on the circuit boards, for example the 3.3V, 5V, ±12V levels. The power converters 112 include appropriate DC-DC converters, filters, and circuit protection elements for power conversion.

Figure 5:
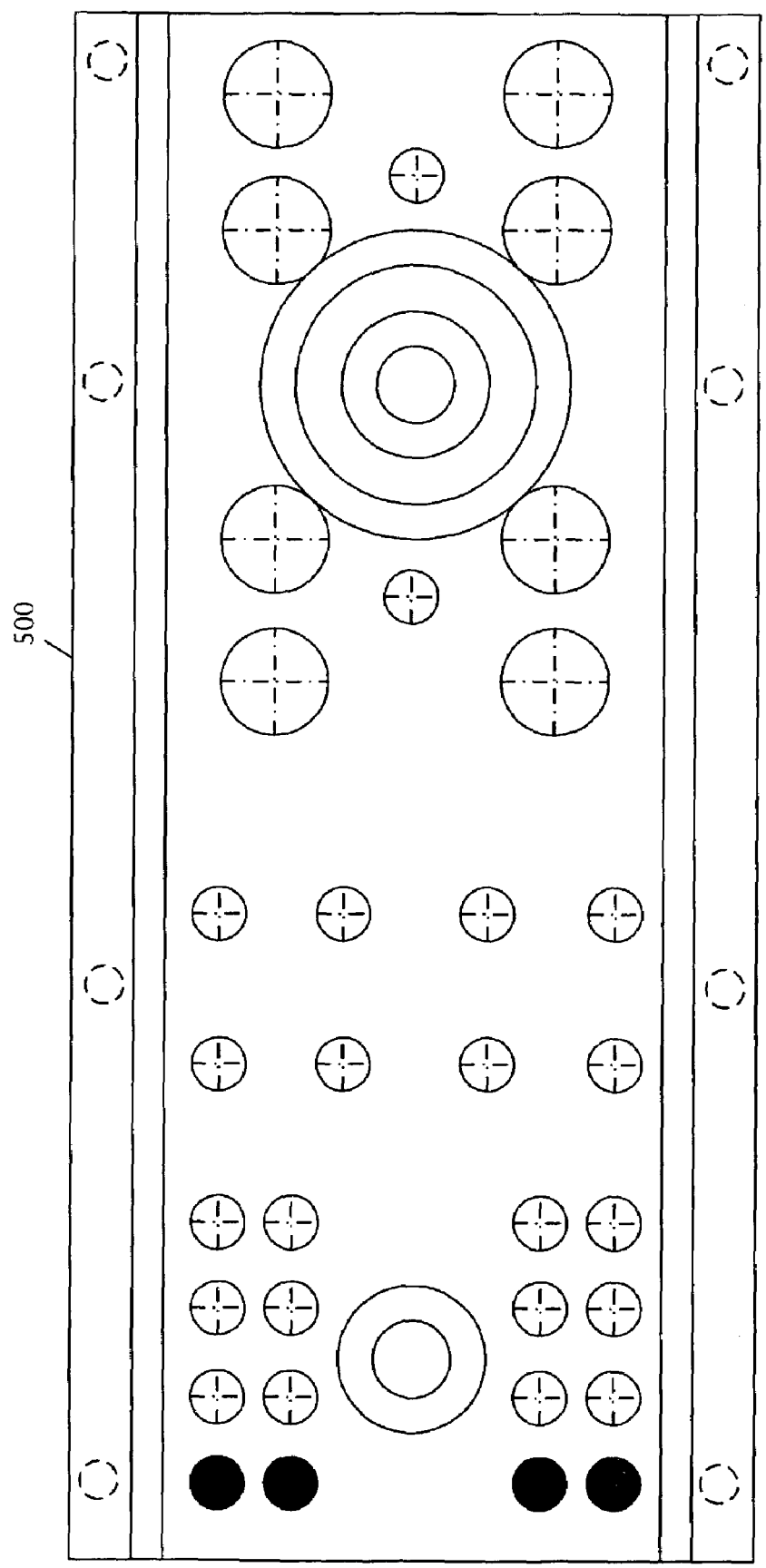
FIG. 5 shows contact assignments for a zonel backplane connector.

Referring to TABLE I in combination with FIG. 5, TABLE I shows contact assignments for a zone 1 backplane connector 500. The individual blades have unique signals that can be monitored and toggled to implement testing. The converter assembly 100 shown in FIG. 1 is configured with programming and programmable flexibility for usage with any blade. The control elements 110 can be reprogrammed according to the particular signaling characteristics of a blade.

TABLE I

| Designation | Contact Number | Mating Sequence Upon Insertion |
| --- | --- | --- |
| Reserved | 1 | N/A |
| Reserved | 2 | N/A |
| Reserved | 3 | N/A |
| Reserved | 4 | N/A |
| HA0 Hardware Address Bit 0 | 5 | Fourth |
| HA1 Hardware Address Bit 1 | 6 | Fourth |
| HA2 Hardware Address Bit 2 | 7 | Fourth |
| HA3 Hardware Address Bit 3 | 8 | Fourth |
| HA4 Hardware Address Bit 4 | 9 | Fourth |

TABLE I-continued

| Designation | Contact Number | Mating Sequence Upon Insertion |
| --- | --- | --- |
| HA5 Hardware Address Bit 5 | 10 | Fourth |
| HA6 Hardware Address Bit 6 | 11 | Fourth |
| HA7/P Hardware Address Bit 7 (Odd parity bit) | 12 | Fourth |
| SCL A IPMB Clock, Port A | 13 | Fourth |
| SDA A IPMB Data, Port A | 14 | Fourth |
| SCL B IPMB Clock, Port B | 15 | Fourth |
| SDA B IPMB Data, Port B | 16 | Fourth |
| MT1_TIP | 17 | Fourth |
| MT2_TIP | 18 | Fourth |
| RG1_TIP | 19 | Fourth |
| RG2_TIP | 20 | Fourth |
| MT1_RING | 21 | Fourth |
| MT2_RING | 22 | Fourth |
| RG1_RING | 23 | Fourth |
| RG2_RING | 24 | Fourth |
| SHELF_GND | 25 | First |
| LOGIC_GND | 26 | First |
| ENABLE_B | 27 | Fifth |
| VRTN_A | 28 | First |
| VRTN_B | 29 | First |
| −48 V_EARLY_A | 30 | First |
| −48 V_EARLY_B | 31 | First |
| ENABLE_A | 32 | Fifth |
| −48 V_A | 33 | Second |
| −48 V_B | 34 | Third |

Figure 6A:
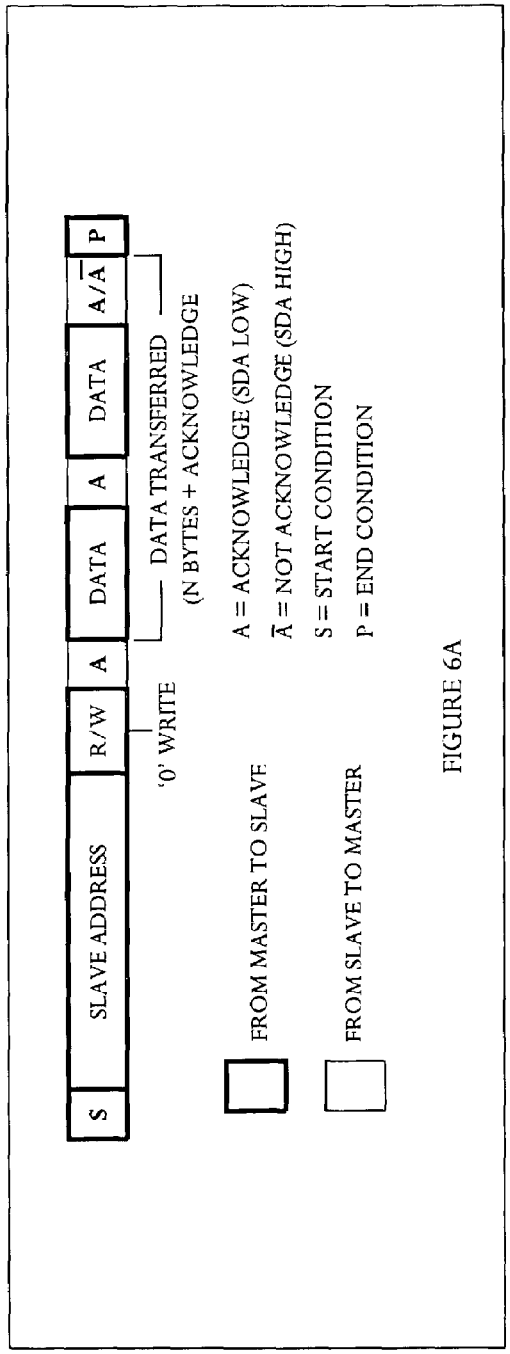
FIGS. 6A and 6B are a bit diagram and associated timing diagram respectively showing an example of data and timing signals for communicating signals on an I²C bus.
Figure 6B:
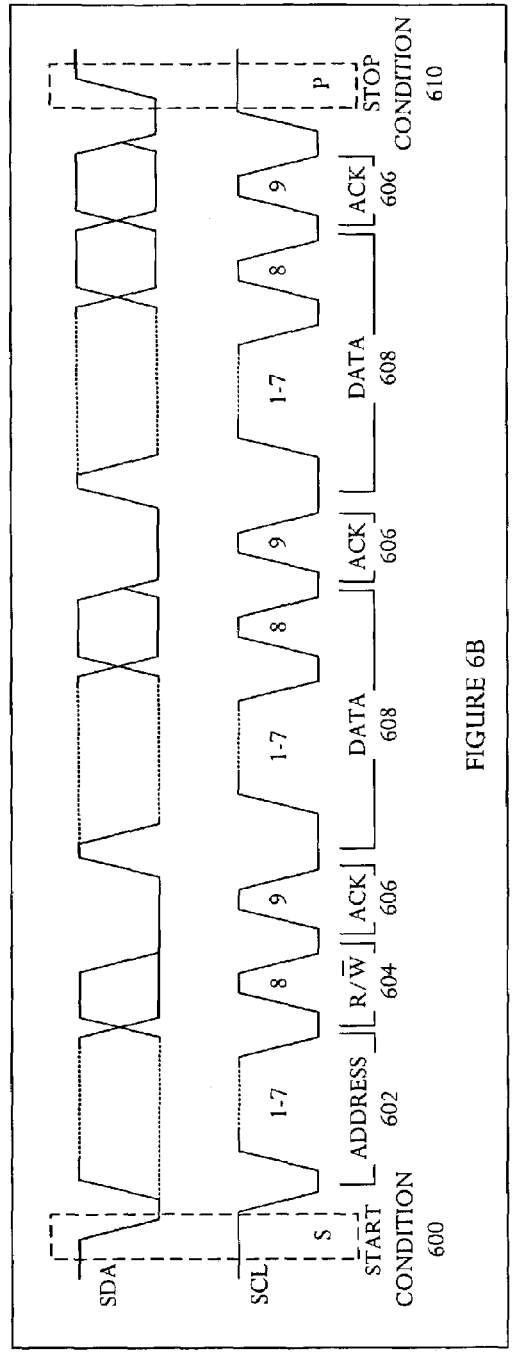

Referring to FIGS. 6A and 6B, a bit diagram and associated timing diagram respectively show an example of data and timing signals for communicating signals on an I²C bus. The timing diagram shows timing of signals on the serial data line (SDA) and serial clock line (SCL) in a complete data transfer. The I²C bus is a simple bi-directional two wire bus for efficient inter-integrated circuit control. I²C bus compatible devices incorporate an on-chip interface that enables direct intercommunication among devices coupled to the I²C bus. The two bus lines for the I²C bus, a serial data line (SDA) and a serial clock line (SCL), are bi-directional lines that carry information between devices connected to the bus. Each device connected to the I²C bus is software addressable by a unique address with simple master/slave relationships defined at all times. Master devices operate as either master-transmitters or master-receivers. A master is the device that initiates a transfer on the bus and generates clock signals permitting the transfer. In response, any device addressed is considered a slave.

The I²C bus is a multiple master bus that includes collision detection and arbitration to prevent data corruption for simultaneous data transfers by more than one master. Data transfers are serial 8-bit oriented and bi-directional at a rate up to 100 kbit/s in standard mode, 400 kbit/s in fast mode, or 3.4 Mbit/s in high-speed mode.

According to the I²C bus specification data on the SDA line must be stable during the HIGH clock period. The HIGH or LOW state of the data line can only change when the clock signal on the SCL line is LOW.

In some embodiments, the system can include interfacing hardware that detects the START and STOP conditions. In other embodiments, the system can sample the SDA line at least twice per clock period to sense the START or STOP transition.

A master generates START and STOP conditions. The I²C bus is considered busy after the START condition and considered to be free a specified time after the STOP condition. The bus remains busy is a repeated START (Sr) is generated rather than a STOP condition. A START (S)

condition is a HIGH to LOW transition on the SDA line while SCL is HIGH. A STOP (P) condition is a LOW to HIGH transition on the SDA line while SCL is HIGH.

Every data byte transferred on the SDA line is 8-bits long with the possible number of bytes unrestricted. Each byte is followed by an acknowledge bit. Data transfers in the order of most significant bit (MSB) first. A slave that cannot receive or transmit a complete data byte until another operation is complete can hold the SCL clock line low to force the master into a wait state with the transfer continuing when the slave is ready.

The master generates an acknowledge-related clock pulse. The transmitter releases the SDA line (HIGH) during the acknowledge clock pulse. The receiver pulls down the SDA line during the acknowledge pulse so that the line remains stable LOW during the HIGH period of the clock pulse. A slave that fails to acknowledge the slave address, for example if busy, leaves the data line high. The master can respond by generating a STOP condition to abort the transfer or a repeated START condition to begin a new transfer. A slave-receiver that acknowledges the slave address and begins a transfer but later cannot continue the transfer can generate a not-acknowledge. The slave leaves the data line HIGH and the master generates either a STOP or repeated START condition. A master-receiver involved in a transfer signals the end of data to the slave-transmitter by not generating an acknowledge on the last byte that was clocked out of the slave.

In the example, a master-transmitter addresses a slave-receiver with a 7-bit address and no change in transfer direction. The master transmits a start bit (S) 600 to the slave to begin the communication, sends the slave address 602, and sends a bit indicative of a data write 604. The slave responds with an acknowledge bit 606 and the master sends the data 608. Between transfers of data 608, the slave sends acknowledge bits 606, an SDA low signal, for N bytes and a final acknowledge/not acknowledge, SDA low signal followed by SDA high signal, after the last data byte. The master terminates the transmission with a stop condition (P) bit 610.

Figure 7:
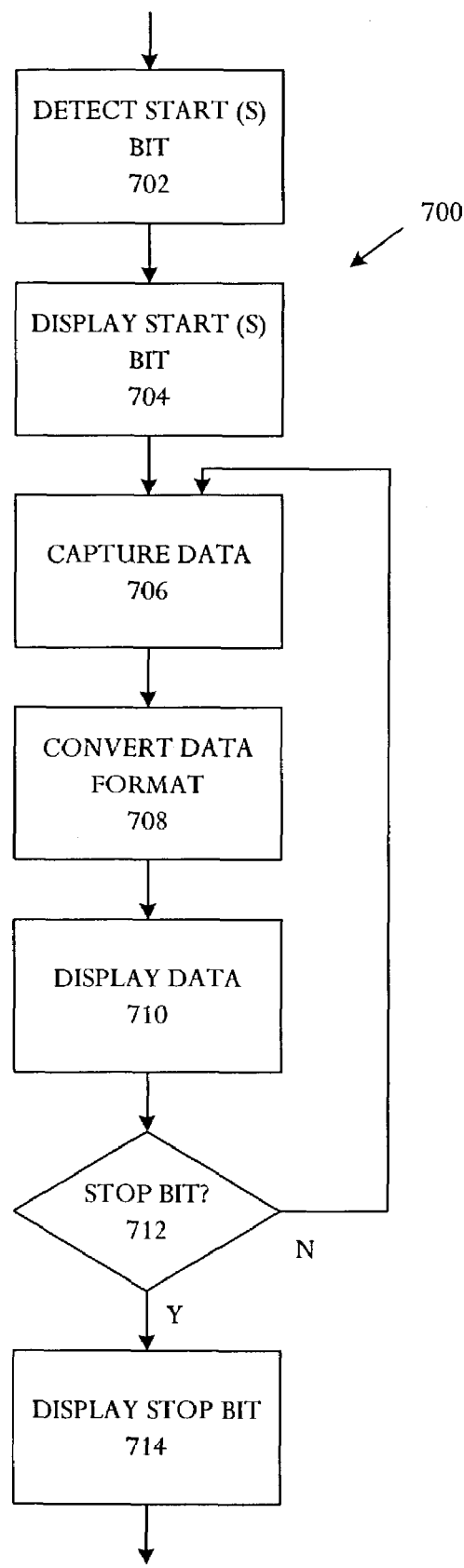
FIG. 7 is a schematic flow chart depicting an example of a programmed process or method that communicates data over the I²C bus.

Referring to FIG. 7, a schematic flow chart depicts an example of a programmed process or method that communicates data 700 over the I²C bus. A processor is programmed to recognize a start bit (S) by monitoring the serial data line (SDA) and determining when the SDA signal goes low and no activity is present on the serial clock line (SCL).

The system can determine whether activity is present on the SCL line by monitoring for a time duration (t>1) determined by the bit rate. For example if the bit rate is 100k, then if SCL does not change for 10 μsec, no activity is present. A stop bit (S) occurs after acknowledge (ACK) or a ninth SCL signal. A stop bit (P) is defined as simultaneous 1 levels on SCL and SDA.

A transfer begins with start bit (S) detection 702 and the system responds by sending a signal indicative of the start bit (S) to a monitor for display 704. The system then captures data bits 706, for example eight bits, and converts the data to a format appropriate for display 708, in one example a hexadecimal display format. The system sends data in the displayable format to the monitor for display 710 and captures an acknowledge bit (0) or not acknowledge bit (1). If the next bit is a stop bit (P) 712, the system sends a signal indicative of communication completion, for example a P code, to the display 714. Otherwise, the system captures a next data bit by looping back to the capture data bit action 706.

In one example, the monitor displays communication data in the form:

S XX A XX A XX AP where S indicates the start bit, P the stop bit, A the acknowledge, and XX hexadecimal data. Other examples may display data in other forms including graphic or image form.

Figure 8:
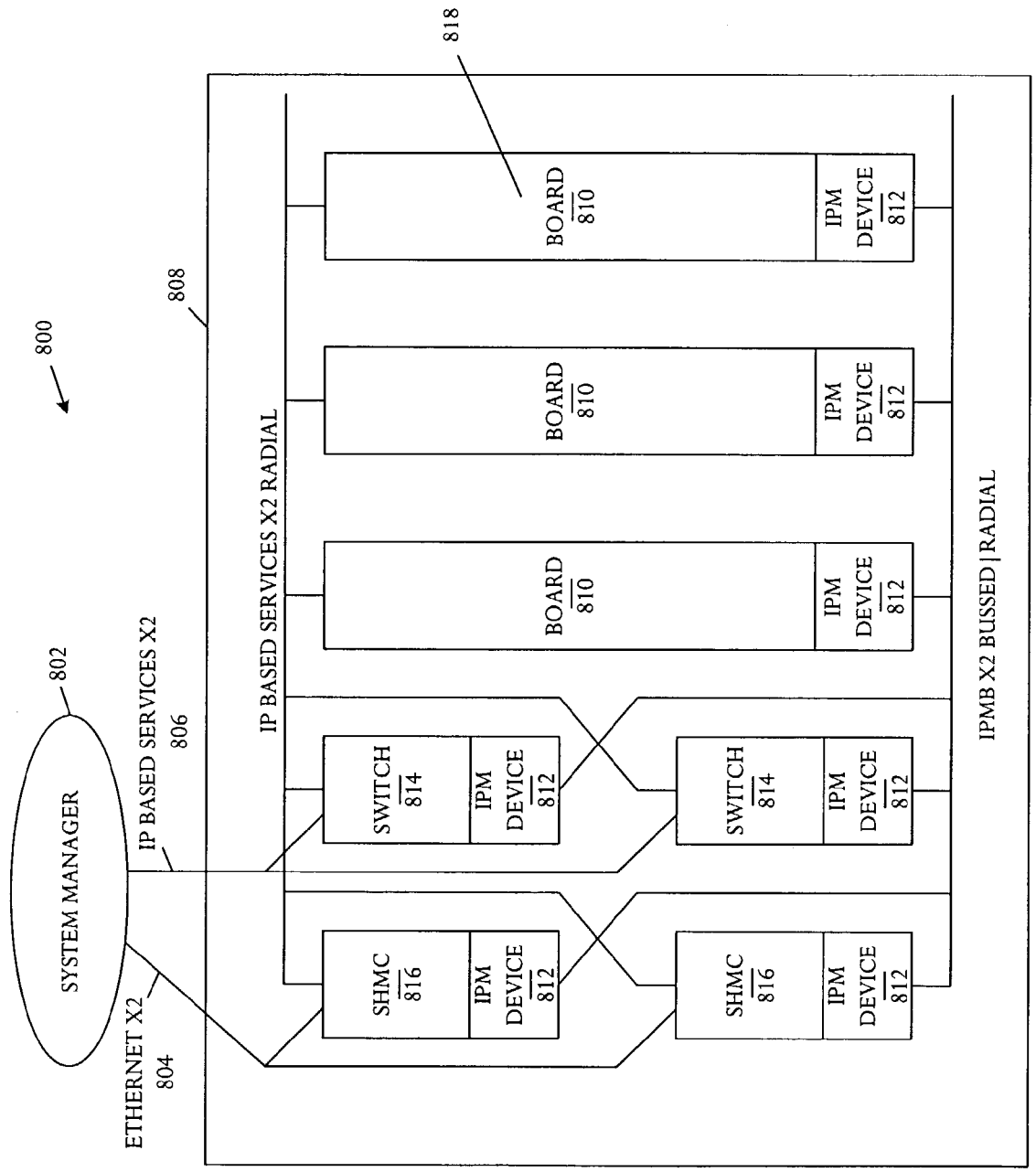
FIG. 8 is a schematic block diagram illustrating an example of a management system, such as a server, that is capable of accepting elements or blades and can be tested using the described converter assembly.

Referring to FIG. 8, a schematic block diagram illustrates an example of a management system 800, such as a server, that is capable of accepting elements or blades and can be tested using the described converter assembly. The illustrative management system 800 can be a PICMG™ 3.0 System. The management system 800 includes a system manager 802 that communicates via Ethernet 804 and Internet Protocol (IP) Based Services 806 with a shelf 808. The shelf 808 contains a plurality of components and boards 810 that can be inserted and removed from the management system 800. The individual elements and boards 810 each have an associated Intelligent Peripheral Management (IPM) device 812. The elements include switches 814 and shelf management controllers (ShMC) 816.

A converter assembly 818 can be inserted as one of the boards 810 to enable testing of any other boards 810, the management system 800, and various interactions among elements and boards of the management system 800. The converter assembly 818 can be used to test a wide range of signals. In some embodiments, the converter assembly 818 can test signals such as address signals, clock signals, data signals, tip signals, ring signals, ground signals, enable signals, and power rails.

A zone 1 shelf management controller 816 has extensive multiple-level management capabilities that may be used by an overall system manager including low-level hardware management services, high-speed management services based on the TCP/IP protocol suite, and in-band application management. Shelf management 816 monitors, controls, and assures proper operation of boards 810 and other shelf components. Shelf management 816 monitors basic system health, reports anomalies, and responds by initiating corrective actions. The shelf management system can retrieve inventory information and sensor readings, receive event reports and failure notifications from boards and other units, and can perform basic recovery operations such as power cycling or entity reset. The converter assembly 818 can monitor traffic to and from the shelf management controller 816 to enable collection and conversion of bus data into a format that can be displayed.

Low-level hardware management services of the shelf management system include control of power, cooling, and interconnect resources. A management entity on individual boards negotiates power usage and cooling needs, and allocates resources, before powering the board. The shelf management system has multiple components including distributed management processors to manage and monitor operation and health, an intelligent peripheral management interface (IPMI) 812 that supplies communications, management, and control among distributed managers, and a higher-level, high-speed service for boards using TCP/IP management services such as remote booting, SNMP management, remote disk services, and other IP-related services.

The Intelligent Peripheral Management (IPM) controller components 812 are powered from the main shelf redundant −48V power buses and are thus operational before any other component, facilitating management of and controlling power to the other components.

Communications and control for the Intelligent Platform Management (IPM) controllers 812 are supplied by an Intelligent Platform Management Interface (IPMI) protocol that defines a baseboard management controller (BMC) that monitors managed devices, reports anomalous conditions, and initiates corrective action. The IPMI monitors hot-swap events from removable devices, indicating entry and detecting shutdown or removal.

Communication and control signals that communicate across the backplane include IPMI command and Field Replaceable Unit (FRU) records. IPMI command definition conventions conform to a specified multiple-byte format. A first byte specifies a Responder Slave Address of a device that is expected to respond to a message. A second byte specifies the network function of the message and logical unit number (LUN) of the unit meant to respond to the message (NetFn/Responder LUN). Third and fourth bytes are a header checksum and request slave address, respectively. A fifth byte is a Request Sequence identifier used to determine whether duplicate requests or responses have been received and a Requester LUN identifying the LUN that should receive the response. A sixth byte identifies the command within NetFN that is to be executed. Bytes 7-N include zero or more, up to 24, command specific data bytes. A final byte is a data checksum of the message back to, but not including, the header checksum.

Every command has a corresponding response in a format that includes a first byte indicative of a request slave address of the requesting device indicative of the device that receives the response. A second byte specifies the network function of the message and logical unit number (LUN) of the unit meant to receive the response (NetFn/Responder LUN). Third and fourth bytes are a header checksum and responder slave address, respectively. A fifth byte is a Request Sequence identifier used to determine whether duplicate requests or responses have been received and a Responder LUN identifying the LUN that sent the response. A sixth byte identifies the command within NetFN that was requested. Byte 7 is a completion code that defines whether the command successfully executed. Bytes 8-N are zero or more, up to 23, command specific response data bytes. A final byte is a data checksum of the message back to, but not including, the header checksum.

The IPM controller 812 implements multiple addressing schemes including four types of addresses, hardware addresses, IPM bus address, physical address, and shelf address. The hardware address is assigned through hardware signals from the backplane or shelf to a module. An IPM controller 812 in the shelf is assigned a hardware address that is "hardwired" on the backplane or elsewhere in the shelf. The converter assembly 818 monitors the addresses as well and data and other information.

The IPM address is used by the IPM controller 812 when sending or receiving information on the IPM bus (IPMB). The IPMB infrastructure is layered above the I$^2$C protocol and supports 7 bit addresses. The hardware address and IPMB address both support 7 bit addressing so that the hardware address can be used without translation as the I$^2$C/IPMB address. Some hardware and IPMB addresses are reserved, including a general call address, and a temporary address for error reporting. The converter assembly 812 snoops the I$^2$C bus to monitor the various types of information for display and analysis.

Physical address describes the physical location of a Field Replaceable Unit (FRU) in the shelf and is used for directing an operator to take an action on the physical FRU. To reduce the bus traffic for an IPM controller to determine addresses, the shelf manager implements a "Get Address Info" command for requested data and response data. For request data, the command uses multiple bytes in a data field including a PICMG™ identifier showing a defined group extension, a FRU device identifier, and an address key type. The request data also includes an address key and a site type for a physical address. The response data includes fields for a completion code, PICMG™ identifier, hardware address, IPMB-0 address, FRU device identifier, site identifier, and site type.

The shelf manager accepts four address types for a lookup value to allow an IPM controller 812 to look up information from another device in the system. The IPM controller 812 controller may implement additional FRUs that do not appear in the address table record. Therefore, a "Get PICMG Properties" command enables querying for the maximum FRU device identifier supported by the IPM controller. Request data for the Get PICMG Properties command includes a PICMG identifier. Response data includes a completion code, the PICMG identifier, a PICMG extension version indicative of extensions implemented by the IPM controller, a maximum FRU device ID, and the FRU device ID for the IPM controller 812.

The "Get Address Info" command can be used by the shelf manager 816 to look up the hardware address in the table using the FRU device ID as an offset. In another example, the shelf manager 816 can use the command to computer the corresponding hardware address from the IPMB.

In addition to addressing individual locations within a shelf 808, the location of a shelf can also be addressed. A "Get Shelf Address Information" command determines shelf address using a single byte of request data, the PICMG identifier. Response data of the command includes a completion code, the PICMG identifier, a shelf address type/length byte identifier, and shelf address bytes for the shelf containing the IPM controller 812.

A "Set Shelf Address Information" command can be implemented by the shelf manager 816 to enable configuration of the shelf address. The "Set Shelf Address Information" command uses a single byte of request data, the PICMG identifier. Response data of the command includes a completion code, the PICMG identifier, a shelf address type/length byte identifier, and shelf address bytes for the shelf containing the IPM controller 812.

The PICMG™ system supports components at the Field Replaceable Unit (FRU) level including mezzanine devices, intelligent fans, non-intelligent removable fans that are managed by other IPM controllers 812 and the like.

IMP controllers generally use multiple sensor devices and maintain a Sensor Device Record (SDR) for each sensor represented by the IPM controller 812. The sensors can be associated with a FRU or can be subordinate to and managed by an IPM. Sensors are capable of issuing events during some state changes. The IPM controller SDR contains a Management Controller Device Record that retrieves information about the IPM controller, associated capabilities, and a FRU device locator record for the individual managed FRUs.

Sensor Data Records (SDRs) describe sensors and other elements in shelf management systems including FRU records, management device locations, object groupings, and others. The FRU record indicates existence and accessibility of FRU devices. The converter assembly 812 can be used to track SDR data.

A hot swap sensor is implemented by each IPM controller 812 and monitors insertion and extraction of a FRU. FRU state can be monitored by querying the hot swap sensor. A FRU hot swap event message indicates a state transition associated with a FRU and specifies multiple request data bytes including an event message code, a sensor type, a sensor number, an event direction indication, and event type, and event data indicative of FRU status such as not installed, inactive, insertion pending, activation in process, active, and extraction pending. Other event data includes event cause such as user deactivation request, change commanded, autonomous state change, surprise extraction state change, and state change from unknown cause. Other data includes a FRU device identifier and a completion code. The converter assembly 812 can be used to access and display hot swap signals.

Other signals that pass across the backplane include device commands that supply control over operational state of the FRUs and FRU LEDs, including FRU reset commands and control over IPMB buses. SetFRUReset is used to force a reset of the payload site of a FRU device so assert and hold, or deassert the reset line, or issue a momentary reset. A SetFRUActivationPolicy command modifies operational state transition behavior of a FRU device. GetFRUActivationPolicy command reads the activation policy. SetFRUActivation command controls the operational state transition of a FRU including activation and deactivation. The converter assembly 812 can monitor and display signals indicative of FRU operational state. SetFRULEDState command enables manual manipulation of FRU LED behavior. GetFRULEDState returns LED state managed by the IPM controller 812 on the FRU.

The shelf manager 816 manages and tracks FRU population and common infrastructure of a shelf, particularly power, cooling, and interconnect infrastructure. The shelf manager 816 also enables the system manager 802 to cooperate in management and tracking through a System Manager Interface. The converter assembly 812 can be used to monitor and display the power, cooling, and interconnect signals for testing and analysis.

IPM controllers 812 and associated sensors are considered to be "dynamic sensor devices" that are discovered by responding to a "Broadcast Get Device ID" message. A "Get Device Locator Record ID" command requests data using a PICMG identifier and FRU device ID. The corresponding response data includes a completion code, the PICMG identifier, and the record ID for the appropriate device locator SDR.

A Field Replaceable Unit (FRU) is a unit that can be replaced by a customer in the field. FRU information relates to information stored within the FRU in a non-volatile storage location. FRU information access commands are read or write IPMI commands directed to the IPM controller that hosts the FRU information. Various types of FRU information may be accessed. For example, shelf FRU information is held in an IPM controller that provides access to the shelf FRU information. Shelf FRU information includes a Board Information Area, a Chassis Information Area, and a Multirecord Area. Shelf FRU devices can be located using interrogation commands including a "Get Address Info" command to find the IPM controller that hosts the information and a "Read FRU Data" command to determine whether the requested data is stored. The converter assembly 812 can be used in various applications to access FRU information and commands to determine various board and shelf information.

The PICMG™ system supports Electronic Keying (e-keying) that utilizes FRU information represented by the various IPM controllers in the shelf to generate Enable/Disable commands according to a sequence of events. First a module is inserted into an operational shelf or power is applied to a shelf. After shelf power-on, the shelf manager is selected and determines backplane characteristics from the shelf FRU information. The module IPM device activates and payload backplane connections remain disabled. Module IPM FRU information is read by the shelf manager 816 to determine channel capabilities for base interface, fabric interface, telephony clocking, update channel interface, and metallic test bus and ring generator bus. The shelf manager issues Enable/Disable Port commands as the channels or ports become available. The converter assembly 812 is capable of accessing and monitoring channel information for purposes including testing.

A shelf 808 can use the Intelligent Peripheral Management Bus (IPMB) for system management communications between all intelligent FRUs. Reliability can be improved by using multiple redundant IPMBs operating in an active-active mode so that both IPMBs carry IMPI traffic simultaneously to effectively double available bandwidth. The PICMG™ backplane includes multiple IPMB channels. In various embodiments, the IPMB management buses can be implemented as standard multiple-drop $I^2C$ buses or other bus configurations such as a star configuration.

IPMB bus control commands are used to enable or disable operational state of IPMB buses for an IPM controller. IPMB physical link sensors are implemented on IPM controllers and are used to monitor the state of the IPMB management interfaces. Interface state can be queried using an IPMI SetSensorReading command with events sent to signify link failure or recovery. A SetIPMBState command enables management software to set IPMB physical link state.

The converter assembly 812 can also monitor shelf manager control of power and cooling. During a discovery stage, the shelf manager 816 collects data from the shelf and from boards 810 and other FRUs regarding power capabilities and requirements. The shelf manager 816 enables boards and FRUs to power up based on capabilities of the shelf 808, in some instances allocating power levels at a lower level than requested. 831 During normal operations the shelf manager 816 waits for event messages from boards 810 and/or FRUs to adjust cooling or power distribution from current operating conditions. No information descriptor or commands are used for the normal operations state. An abnormal operation state occurs when a board or FRU generates an event message requesting shelf services from the shelf manager. The shelf manager responds, for example by adjusting system cooling or power to return the module to the normal operation state. The abnormal operation state begins when a board or FRU generates an event message requesting shelf services from the shelf manager. Typically, the shelf manager will adjust system cooling or power to one or more modules to attempt to return to the normal state.

The boards 810 and FRUs inform the shelf manager 816 of the average statistical maximum power draw when powered off and on. For example, the shelf manager queries the individual FRU/IPM device using a ComputePowerProperties command. A FRU responds to the command with the number of spanned slots, IPM location, and management power draw. The shelf manager queries each FRU/IPM device using a GetPowerLevel command. The FRU responds with variable such as steady state power draw levels, desired steady state power draw level, early power draw level, and desired early draw power level. The shelf manager 816 informs the FRU/IPM device of the appropriate allocated power level using a SetPowerLevel command that is either the desired power level or an alternative specific power level. The FRU responds to acknowledge the power level setting.

Power negotiations can occur when a shelf 808 first receives power, when a board or FRU is hot-swapped, or when a board or FRU determines a change is appropriate. Power negotiation is divided into four different messages. The first command of the power negotiation sequence is a ComputePowerProperties command that is sent by the shelf 808 manager to the IPM controller 812 to inform the device to lock desired power and cooling levels. The IPM controller 812 returns part of the data in response to the command including the number of spanned slots, the IPM controller location, and management power draw. The IPM controller also responds to the ComputePowerProperties command by preparing for receipt of a GetPowerLevel command, specifically by caching desired power levels. The shelf manager uses the information to determine the desired power level of the FRU and corresponding levels of power draw. The shelf manager sends a SetPowerLevel command if the power budget allows the FRU to change power level. The command can enable or disable the payload.

When a FRU desires to change power level, the IPM controller 812 sends a RenegotiatePower command to the shelf manager for the FRU or all FRUs under the IPM controller 812. A RenegotiatePower command designates which FRU desires to have power levels renegotiated. The command informs the shelf manager 816 to begin a negotiation with the FRU(s). At the end of the renegotiation, the shelf manager sends a SetPowerLevel command to the IPM controller to convey the conclusion.

Power renegotiation begins when a FRU or board requests a new power level using a RenegotiatePowerLevels command. The shelf manager acknowledges the FRU/board request and queries each FRU/IPM device using a ComputePowerProperties command. FRU responds to the command with the number of spanned slots, the IPM location, and management power draw. The get or set power level transaction then takes place.

The converter assembly 812 can be used to access and monitor the various aspects of power negotiation and renegotiation.

Other commands include GetFanSpeedProperties and GetFanLevel commands for cooling management operations. The converter assembly 812 can monitor various fan information and diagnostics.

While the present disclosure describes various embodiments, these embodiments are to be understood as illustrative and do not limit the claim scope. Many variations, modifications, additions and improvements of the described embodiments are possible. For example, those having ordinary skill in the art will readily implement the steps necessary to provide the structures and methods disclosed herein, and will understand that the process parameters, materials, and dimensions are given by way of example only. The parameters, materials, and dimensions can be varied to achieve the desired structure as well as modifications, which are within the scope of the claims. Variations and modifications of the embodiments disclosed herein may also be made while remaining within the scope of the following claims. For example, the disclosed system or server is described as compliant with the PICMG™ 3.0 specification. Other examples may be compliant with other standards, partially compliant with a standard, compliant with parts or all of multiple standards, or may be compliant with no standards. Similarly, the description specifically describes particular signals that can be monitored and tested using the converter assembly. Some embodiments may be capable of testing different signals or may not implement testing of the particular signals, phenomena, and conditions described herein. The disclosed system is described as performing the access and monitoring functions via the I²C bus. In other embodiments, other buses may be accessed or monitored. In some embodiments, the signals may be accessed from lines or test points that are not buses.

What is claimed is:

1. A converter assembly comprising:
   a backplane interface to a backplane compliant with a first open architecture modular computing system standard;
   a component interface capable of coupling to a component compliant with a second open architecture modular computing system standard; and
   a control element coupled between the backplane interface and the component interface, the control element being capable of programmable routing connection lines and signals between the component interface and the backplane interface, wherein:
   the converter has mechanical and signal characteristics that are compliant with PCI Industrial Computer Manufacturers Group (PICMG™) specification, the first open architecture modular computing system standard being compliant with PICMG™ 3.0 standard and the second open architecture modular computing system standard being compliant with the PICMG™ 2.16 standard.

2. The converter assembly according to claim 1 wherein:
   the second open architecture modular computing system standard and the first open architecture modular computing system standard have different form factors.

3. The converter assembly according to claim 1 wherein:
   the backplane has at least one channel including a bi-directional two wire bus; and
   the control element is configured for snooping the bi-directional two wire bus and converting data on the bi-directional two wire bus to a readable format.

4. The converter assembly according to claim 3 wherein:
   the bi-directional two wire bus is an inter-integrated circuit (I²C) bus and the two bus wires comprise a serial data line (SDA) and a serial clock line (SCL).

5. The converter assembly according to claim 4 further comprising:
   a process executable in the control element that snoops the I²C bus by monitoring for the SDA to go low and no activity on the SCL to detect a START bit, capturing a data byte, sending a hexadecimal character to a display interface for display, capturing ACK/NACK, determining a STOP bit after ACK, and looping to capture another data byte if STOP bit is determined.

6. The converter assembly according to claim 1 wherein:
   the control element is programmable and configured for snooping of a bus to optimize test functionality of multiple types of components that can be inserted into the component interface.

7. The converter assembly according to claim 6 wherein:
   the control element can be programmed with a downloadable program to download different test functions and configured for snooping of a bus to optimize test functionality of multiple types of components that can be inserted into the component interface.

8. The converter assembly according to claim 1 wherein:
   the control element is configured for monitoring signals selected from among a group comprising address signals, clock signals, data signals, tip signals, ring signals, ground signals, enable signals, and power rails.

9. A converter assembly comprising:

a backplane interface to a backplane compliant with a first open architecture modular computing system standard and having at least one channel including a bi-directional two wire bus;

a component interface capable of coupling to a component compliant with a second open architecture modular computing system standard;

a plurality of interconnect lines routing connection lines and signals between the component interface and the backplane interface;

a display interface capable of coupling to a display; and a control element coupled to the backplane interface, the component interface, and the display interface, the control element being capable of snooping the bi-directional two wire bus and converting data on the bi-directional two wire bus to a readable format for display via the display interface, wherein:

the converter has mechanical and signal characteristics that are compliant with PCI Industrial Computer Manufacturers Group (PICMG™) specification, the first open architecture modular computing system standard being compliant with PICMG™ 3.0 standard and the second open architecture modular computing system standard being compliant with the PICMG™ 2.16 standard.

10. The converter assembly according to claim 9 wherein:

the second open architecture modular computing system standard and the first open architecture modular computing system standard have different form factors.

11. The converter assembly according to claim 9 wherein:

the bi-directional two wire bus is an inter-integrated circuit ($I^2C$) bus and the two bus wires comprise a serial data line (SDA) and a serial clock line (SCL).

12. The converter assembly according to claim 11 further comprising:

a process executable in the control element that snoops the $I^2C$ bus by monitoring for the SDA to go low and no activity on the SCL to detect a START bit, capturing a data byte, sending a hexadecimal character to the display interface for display, capturing ACK/NACK, determining a STOP bit after ACK, and looping to capture another data byte if STOP bit is determined.

\* \* \* \* \*

UNITED STATES PATENT AND TRADEMARK OFFICE
CERTIFICATE OF CORRECTION

PATENT NO. : 7,281,076 B2 Page 1 of 1
APPLICATION NO. : 10/427767
DATED : October 9, 2007
INVENTOR(S) : Kirk Yates et al.

It is certified that error appears in the above-identified patent and that said Letters Patent is hereby corrected as shown below:

In column 4, line 57, delete "scan" and insert -- can --, therefor.

In column 14, line 41, after "requested." delete "831".

In column 16, line 18, in Claim 1, delete "programmable" and insert -- programmably --, therefor.

Signed and Sealed this

Tenth Day of June, 2008

JON W. DUDAS
*Director of the United States Patent and Trademark Office*